United States Patent [19]

Fujishima et al.

[11] Patent Number: 4,752,709
[45] Date of Patent: Jun. 21, 1988

[54] SURFACE ACOUSTIC WAVE DEVICE

[75] Inventors: Satoru Fujishima, Muko; Hideharu Ieki, Nagaokakyo, both of Japan

[73] Assignee: Murata Manufacturing Co., Ltd., Japan

[21] Appl. No.: 14,095

[22] Filed: Jan. 29, 1987

Related U.S. Application Data

[63] Continuation of Ser. No. 698,774, Feb. 6, 1985, abandoned.

[30] Foreign Application Priority Data

Feb. 13, 1984 [JP] Japan .................. 59-25392

[51] Int. Cl.$^4$ ............................................. H01L 41/08
[52] U.S. Cl. ............................ 310/313 A; 310/313 B; 333/151; 333/155
[58] Field of Search ........... 310/313 B, 313 A, 313 R; 333/155, 151; 367/164

[56] References Cited

U.S. PATENT DOCUMENTS

| | | | |
|---|---|---|---|
| 3,550,045 | 12/1970 | Adler | 333/72 |
| 3,559,115 | 1/1971 | De Vries | 333/72 |
| 4,025,954 | 5/1977 | Bert | 310/313 B X |
| 4,037,176 | 7/1977 | Ono et al. | 310/313 B X |
| 4,193,045 | 3/1980 | Houkawa et al. | 310/313 B |
| 4,243,960 | 1/1981 | White et al. | 310/313 R |
| 4,322,651 | 3/1982 | Inoue et al. | 310/313 B |
| 4,354,130 | 10/1982 | Ono et al. | 310/313 A |

OTHER PUBLICATIONS

*Monolithic Sezawa Wave Storage Correlators and Convolvers* by J. E. Bowers, B. T. Khuri-Yakub, and G. S. Kino; conference: 1980 Ultrasonics Symposium Proceedings, Boston, MA; 5-7 Nov. 1980.

Primary Examiner—Charles T. Jordan
Assistant Examiner—John W. Eldred
Attorney, Agent, or Firm—Ostrolenk, Faber, Gerb & Soffen

[57] ABSTRACT

A surface acoustic wave device comprising a surface acoustic wave substrate member composed by forming an aluminum oxide film and a thin zinc oxide film successively on a glass substrate. The thickness $h_1$ of the aluminum oxide film and the thickness $h_2$ of the zinc oxide film are set within ranges of $0.1 \leq h_1/\lambda \leq 10$ and $0.05 \leq h_2/\lambda \leq 0.35$ (where $\lambda$ is representative of wavelength of Sezawa wave) respectively, thereby to utilize Sezawa wave or a similar mode wave transmitted on the surface acoustic wave substrate member in multi-layer structure.

1 Claim, 3 Drawing Sheets

SURFACE ACOUSTIC WAVE DEVICE

CROSS-REFERENCE TO RELATED APPLICATION

This is a continuation application of Ser. No. 698,774, filed Feb. 6, 1985, now abandoned.

BACKGROUND OF THE INVENTION

The present invention relates to a surface acoustic wave device which is applicable to high frequencies.

In general, an interdigital transducer (IDT) is employed as an electromechanical transducer of a surface acoustic wave device, and the width W of the finger of a comb-shaped electrode in the IDT is proportionate to the wavelength $\lambda$ (generally the width W is $\frac{1}{4}$ or $\frac{1}{8}$ of the wavelength $\lambda$), that is, inversely proportional to the frequency f, and thus the width W is narrowed in a high frequency device, wherefore formation of the IDT by, e.g., photoetching is made difficult.

However, since it is well known in the art that the relation between the frequency f, the wavelength $\lambda$ and SAW (surface acoustic wave) velocity v is represented by the equation $\lambda = v/f$, the wavelength $\lambda$ is increased by raising the SAW velocity v, wherefore formation of the IDT is simplified even if the device is applied to high frequencies.

Further, electromechanical conversion efficiency of the IDT depends on the square value $k^2$ of an electromechanical coupling coefficient k of a substrate employed therein, and the conversion efficiency is improved as the value k is increased.

Thus, there is required a substrate of high SAW velocity having a high coupling coefficient as the substrate to be employed in a high frequency surface acoustic wave device.

With respect to a substrate generally employed in a conventional surface acoustic wave device, lithium niobate (LiNbO$_3$) is selected as the material applicable to high frequencies with the SAW velocity v being about 4000 m/s the square value $k^2$ of the coupling coefficient k being equal to 5.6%. On the other hand, there has been proposed a substrate member utilizing so-called Sezawa wav or higher mode by forming zinc oxide (ZnO) film on a sapphire substrate or an alumina ceramic substrate. In such structure, the SAW velocity v is 5500 to 6000 m/s, which is over 1.4 times as large as that of the LiNbO$_3$ substrate though the value $k^2$ of about 5% is similar to that of the LiNbO$_3$ substrate, and in view of the high SAW velocity value v, ZnO on the sapphire substrate is more suitable as the material for the substrate applicable to a high frequency device. However, sapphire is considerably expensive in comparison with LiNbO$_3$. Further, with respect to the alumina ceramic substrate, it is difficult to obtain a mirror face suitable for formation of a fine IDT pattern while the propagation loss is increased in a high frequency range since the same is a sintered substance having large grain sizes, wherefore it is difficult to apply the alumina ceramic substrate to a high frequency device.

SUMMARY OF THE INVENTION

An object of the present invention is to overcome the aforementioned disadvantages of the prior art by providing a surface acoustic wave device in which a substrate of high SAW velocity and high coupling coefficient are implemented while maintaining practically applicable manufacturing cost and workability, for facilitating application to high frequencies and high efficiency simply at a low cost.

According to the present invention, briefly stating, there is employed a surface acoustic wave substrate member of three-layer structure consisting of a dielectric substrate, an oxide film and a piezoelectric thin film, with thickness $h_1$ of the oxide film and thickness $h_2$ of the piezoelectric thin film being within the ranges of $0.1 \leq h_1/\lambda \leq 10$ and $0.05 \leq h_2/\lambda \leq 0.35$ respectively, in which $\lambda$ is representative of the wavelength of Sezawa wave, thereby to utilize Sezawa wave (or similar mode wave) on the surface acoustic wave substrate member. Although Sezawa wave is generally considered as a sort of the surface acoustic wave on a substrate member of two-layer structure, a similar surface acoustic wave may be transmitted on the substrate member of three-layer structure as in the present invention, and such surface acoustic wave is hereinafter referred to as "Sezawa wave" in this specification.

The above and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the attached drawings.

Figure 1:
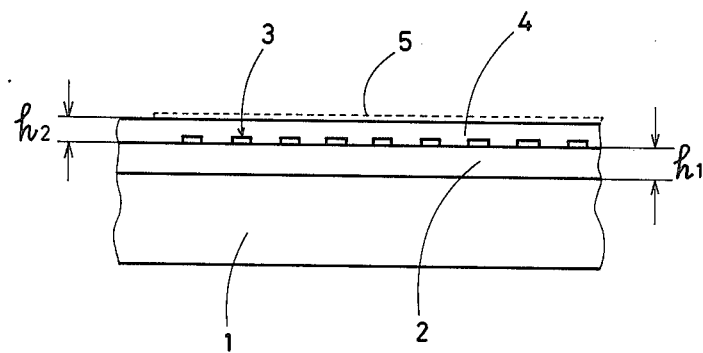
FIG. 1 is a cross-sectional view showing an embodiment of a surface acoustic wave device according to the present invention.

In FIG. 1, a dielectric substrate 1 is formed by borosilicate glass material, which is low in cost and ready for forming a mirror face. On the glass dielectric substrate 1, there is formed a thin film 2 of aluminum oxide (Al$_2$O$_3$) by, e.g., RF sputtering. According to the present embodiment, the film thickness $h_1$ of the Al$_2$O$_3$ thin film 2 is about 30 $\mu$m. On the Al$_2$O$_3$ thin film 2, there is formed an interdigital transducer (IDT) 3 consisting of comb-shaped electrodes having wavelength $\lambda$ of 100 $\mu$m, on which a piezoelectric thin film 4 of zinc oxide (ZnO) is formed by sputtering. Such an interdigital transducer may be formed on the dielectric substrate 1 or on the piezoelectric thin film 4 instead of on the Al$_2$O$_3$ thin film 2.

Figure 4:
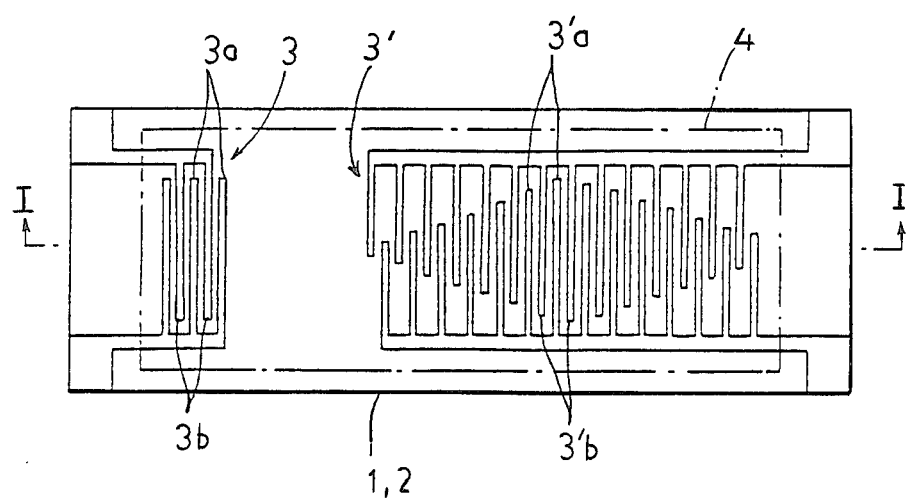
FIG. 4 is a top view of the embodiment of the invention shown in cross-section in FIG. 1.

FIG. 4 is a top view of the embodiment of the invention shown in cross-section in FIG. 1. In this view, two interdigital transducers 3,3' are shown. The transducer 3 comprises interleaved comb-shaped electrodes 3a and 3b. The transducer 3' comprises two interleaved comb-shaped electrodes 3'a and 3'b.

Figure 2:
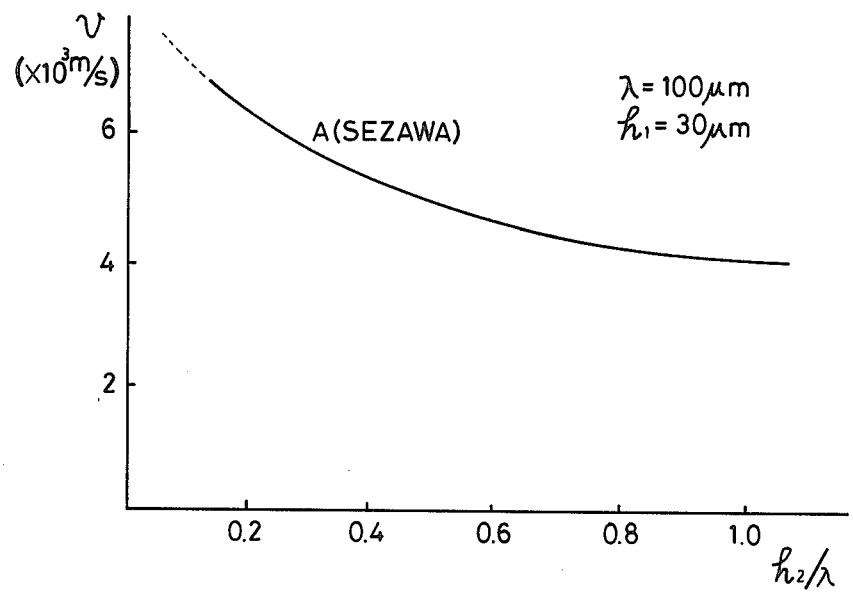
FIGS. 2 and 3 are characteristic diagrams showing values v and $k^2$ of a surface acoustic wave substrate member employed in the embodiment of the present invention
Figure 3:
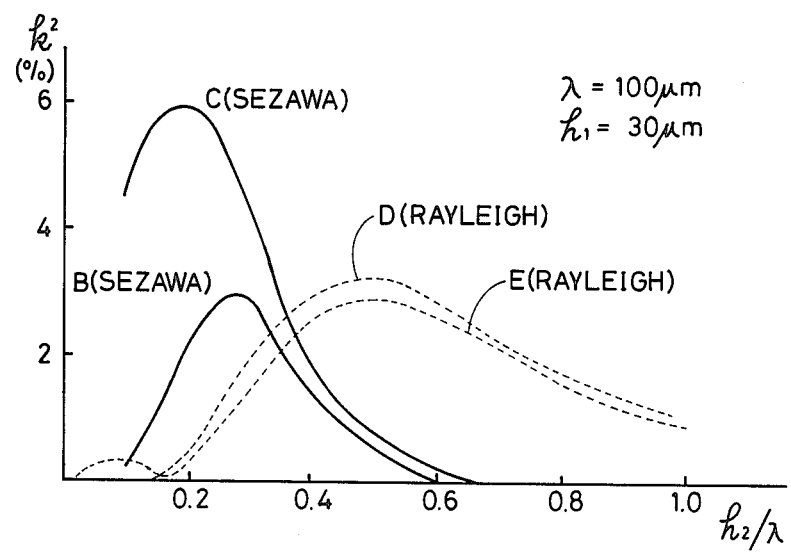

In the three-layer structure of the ZnO/Al$_2$O$_3$/glass substrate member formed in the aforementioned manner, measurement is performed with respect to the SAW velocity v and the square value $k^2$ of the electromechanical coupling coefficient k of Sezawa wave and Rayleigh wave upon change in the film thickness $h_2$ of the ZnO thin film 4, the results of which are shown in FIGS. 2 and 3. Further, a short-circuit electrode 5 (counter electrode shown — in FIG. 1 by dotted lines) is formed over the uppermost ZnO thin film 4 to effect similar measurement, the results of which are also shown in FIGS. 2 and 3.

In FIG. 2, the characteristic curve A represents the SAW velocity v of the Sezawa wave. The characteristic A is not substantially influenced by provision of the short-circuit electrode.

FIG. 3 shows the square value $k^2$ of the electromechanical coupling coefficient k, and the characteristic curve B represents the Sezawa wave utilized in the embodiment a shown in FIG. 1 in which no short-circuit electrode is provided and the characteristic curve C also represents the Sezawa wave transmitted in a case where the short-circuit electrode 5, as shown in FIG. 1 by dotted lines, is further provided, while the characteristic curve D represents the Rayleigh wave transmitted in a case where no short-circuit electrode is provided and the characteristic curve E represents the Rayleigh wave transmitted in a case where the short-circuit electrode is provided.

As clearly seen from FIG. 2, the SAW velocity v in the Sezawa wave (characteristic curve A) is over 4000 m/s, and particularly around $h_2/\lambda = 0.25$, high SAW velocity of over 6000 m/s is obtained. Further, with respect to the value $k^2$, there is the relation of $k^2 \approx 2.5\%$ around $h_2/\lambda = 0.22$ as seen from the characteristic curve B in FIG. 3, which value of about 2.5% is sufficient since the practically applicable minimum value is about 0.5 to 0.6%. Particularly when the short-circuit electrode is provided, there is obtained extremely large value, i.e., $k^2 \approx 5\%$ and over (characteristic curve C).

The Rayleigh wave is rendered spurious when the Sezawa wave is utilized as in the present invention, though, the value $k^2$ of the Rayleigh wave is smaller than the value $k^2$ of the Sezawa wave in a case where the value $h_2/\lambda$ is smaller than 0.35 as shown in FIG. 3 and the value $k^2$ of the Rayleigh wave is substantially zero particularly when the value $h_2/\lambda$ is smaller than 0.2, whereby such spuriousness can be disregarded. Therefore, the value $h_2/\lambda$ is preferably not more than 0.35. With respect to the Sezawa wave, further, a state of mode cut-off is induced when the value $h_2/\lambda$ is around 0.05 and the propagation loss is increased when the subject value becomes smaller than 0.05, and hence the preferable range of the value $h_2/\lambda$ is $0.05 \leq h_2/\lambda \leq 0.35$.

With respect to the film thickness $h_1$ of the $Al_2O_3$ thin film 2, the Sezawa wave is generated when the value $h_1/\lambda$ equals or exceeds 0.1, and in consideration of irregularity in the surface of the film 2 and stress caused in the same when the film thickness $h_1$ is too large, the practically applicable range of the value $h_1/\lambda$ is $0.1 \leq h_1/\lambda \leq 10$. More preferably, the applicable range of the value $h_1/\lambda$ is $0.1 \leq h_1/\lambda \leq 1.0$ particularly when the employed wavelength $\lambda$ is about 100 μm.

According to the present embodiment, there is readily obtained a surface acoustic wave device provided with a substrate member of high SAW velocity having a relatively high coupling coefficient.

Since, according to the present embodiment, the dielectric substrate is made of glass, the surface acoustic wave device can be manufactured at an extremely low cost in comparison with that employing a sapphire or $LiNbO_3$ substrate. Further, the characteristic in the high frequency range is improved according to the present embodiment since surface flatness of the glass substrate is excellent and the propagation loss thereof is decreased in comparison with an alumina ceramic substrate. Although the dielectric substrate may be made of plastic or metal material, glass is optimum as the material therefor in view of excellence in surface flatness, i.e., readiness in formation of the IDT and reasonableness in cost.

With respect to the oxide film, $Al_2O_3$ is preferable in view of readiness in formation of the film, although beryllium oxide (BeO) may be employed as the material for the film other than $Al_2O_3$. The $Al_2O_3$ film may be formed by processes such as the CVD process, the MO-CVD process or RF ion plating other than RF sputtering process targetting $Al_2O_3$.

Although zinc selenide (ZnSe), cadmium sulfide (CdS) etc. may be employed as the material for the piezoelectric thin film other than ZnO, the piezoelectric thin film is most preferably made of ZnO in consideration of the coupling coefficient and readiness in formation of the film. Similarly to the case of the oxide film, the piezoelectric thin film may be formed by processes such as sputtering, the CVD process and ion plating.

Further, the surface acoustic wave to be utilized is not restricted to the fundamental wave of the IDT, and the response of the third harmonic wave or other higher harmonics may be utilized. Assuming that, in this case, the fundamental period of the IDT is represented by $\lambda_0$, it is clear that the wavelength $\lambda_n$ of the n-order high harmonic wave is represented by the relation $\lambda_n = \lambda_0/n$.

Further, although the above description of the present embodiment has been made with respect to the substrate member of three-layer structure, the present invention may be applied to a device comprising four or more layers in entire structure with a dielectric substrate consisting of two or more layers.

Since, as hereinabove described, a surface acoustic wave substrate member in three-layer structure of piezoelectric thin film/oxide film/dielectric substrate is employed in the present invention, there can be implemented a surface acoustic wave device having a substrate member of high SAW velocity having a relatively high coupling coefficient which is suitable for high frequencies at a low cost, leading to extensive usefulness in the industrial field.

What is claimed is:

1. A surface acoustic wave device comprising:
   a glass substrate;
   an oxide film formed on said substrate; and
   a piezoelectric thin film formed on the oxide film; a thickness $h_1$ of said oxide film and thickness $h_2$ of said piezoelectric thin film being set within ranges of $0.1 \leq h_1/\lambda \leq 10$ and $0.05 \leq h_2/\lambda \leq 0.35$ respectively, thereby to utilize Sezawa wave transmitted on said surface acoustic wave device in said multilayer structure, wherein $\lambda$ is representative of wavelength of said Sezawa wave; and further comprising
   at least one interdigital transducer formed on a surface of said piezoelectric film, for receiving a signal and generating a surface acoustic wave in said device in response to said signal;
   wherein said oxide film comprises a thin film of aluminum oxide ($Al_2O_3$), and said piezoelectric thin film comprises a thin film of zinc oxide (ZnO).

* * * * *